(12) United States Patent
Deng

(10) Patent No.: US 7,653,271 B2
(45) Date of Patent: Jan. 26, 2010

(54) DISTRIBUTED FEEDBACK LASER ARRAY

(75) Inventor: Hongyu Deng, Saratoga, CA (US)

(73) Assignee: Finisar Corporaiton, Sunnyvale, CA (US)

( * ) Notice: Subject to any disclaimer, the term of this patent is extended or adjusted under 35 U.S.C. 154(b) by 77 days.

(21) Appl. No.: 12/106,784

(22) Filed: Apr. 21, 2008

(65) Prior Publication Data

US 2009/0263074 A1      Oct. 22, 2009

(51) Int. Cl.
G02B 6/12 (2006.01)
H01S 3/08 (2006.01)

(52) U.S. Cl. .............................. 385/14; 385/39; 385/49; 385/50; 372/96

(58) Field of Classification Search ................... 385/30, 385/43, 50
See application file for complete search history.

(56) References Cited

U.S. PATENT DOCUMENTS 6,075,799 A * 6/2000 Uchida et al. ................. 372/27

FOREIGN PATENT DOCUMENTS

JP          62229105 A * 10/1987

* cited by examiner

*Primary Examiner*—Sarah Song
(74) *Attorney, Agent, or Firm*—William S. Parks; Watt,Tarran & Combs, LLP

(57) ABSTRACT

The present invention provides a low-cost, high-bandwidth optical laser array where subsequent streams of data are injected in a serial fashion. The invention permits the creation of multiple channels of data on a single optical substrate without the use of costly multiplexer arrays to consolidate various optical signals. Further, the serial array eliminates the need for the parallel alignment of optical data sources, such as lasers, and instead allows for the serial alignment of the optical data sources, resulting in decreased footprint applications.

3 Claims, 1 Drawing Sheet

DISTRIBUTED FEEDBACK LASER ARRAY

FIELD OF THE INVENTION

The present invention provides a low-cost, high-bandwidth optical laser array where subsequent streams of data are injected in a serial fashion. The invention permits the creation of multiple channels of data on a single optical substrate without the use of costly multiplexer arrays to consolidate various optical signals. Further, the serial array eliminates the need for the parallel alignment of optical data sources, such as lasers, and instead allows for the serial alignment of the optical data sources, resulting in decreased footprint applications.

BACKGROUND OF THE INVENTION

Increasingly, the field of photonics is helping to achieve high bandwidth communications to replace traditional electrical connections. Fiber optic communication involves the process of transporting data at high speeds by using light to transmit a signal over a glass fiber. However, as communication speeds increase, traditional single mode laser configurations have become impractical and instead, most solutions achieve high transmission rates via multiplexing.

A traditional laser generates infrared light which may then be tuned and filtered to a specific wavelength. Once this single wavelength is established, data is placed on the transmission signal and transmitted via a glass fiber. However, the amount of data that can be transmitted via a single wavelength/single mode fiber is limited. Although enormous bandwidth may be available on a single-mode optical fiber, transmission of data sufficient to occupy that bandwidth would result in a data rate far higher than what can be handled by both senders and receivers. Therefore, in an attempt to deal with this barrier and satisfy the need for transmission of high volumes of data, multiple optical laser channels are usually combined. Typically, 4-10 channels are combined to achieve a higher data rate, and although each individual channel may have a lower data rate than a single mode laser, the aggregate of the multiple data streams is well in excess of that which can be technologically achieved by a single mode signal.

In order to aggregate multiple individual laser signals, individual signals are created as in a single mode application and the multiple lasers are positioned parallel to each other. These individual light streams of varying wavelengths are then focused and passed through a multiplexer to combine the multiple wavelengths onto a single strand of fiber.

Finally, the receiving end of the signal reverses the process. A de-multiplexer separates the data stream received from the optical fiber and separates the signal into its component wavelengths. These individual data streams are then routed to photodetectors to convert the light into electrical signals which can then be used with traditional electronic components. Logic circuits on the host device are then able to process the signal just as if it had been received as a traditional electrical signal over a copper wire.

ADVANTAGES AND SUMMARY OF THE INVENTION

The significant advantage provided by the present invention is the novel method in which multiple channels of laser light may be combined onto a single optical fiber in order to create a low cost and high bandwidth solution for transmitting data. Traditional high bandwidth solutions involve the parallel arrangement of multiple optical sources and the necessity for related equipment, such as a multiplexer, in order to effectively combine the individual optical sources on a single optical fiber. The present invention attempts to circumvent many of the issues which arise in a parallel configuration by aligning multiple optical sources in an "in-line" configuration which allows for the serial injection of multiple data streams onto a single optical fiber.

In one potentially preferred embodiment of the current invention, multiple Distributed Feedback Lasers ("DFB") lasers are aligned in a serial orientation to achieve a high bandwidth, low cost solution. Each individual DFB laser device comprising the array is composed of a DFB laser, an individual waveguide, and access to a shared waveguide. Each individual DFB laser is such that it transmits a portion of the overall data capable of being transmitted by the optical fiber. In one embodiment there may be assembled an array of between 4 and 10 individual DFB lasers comprising an equivalent number of channels of data in the optical fiber.

An essential aspect of the invention relates to the individual waveguide associated with each DFB laser. Each particular DFB laser channel is carried upon a first discretely modulated wavelength which is then amplified through the first waveguide. Each DFB laser utilizes this unique waveguide positioned vertically above a second shared waveguide to ensure the transmission of data using a specific wavelength. This first waveguide also comprises a lateral taper for moving light between the first waveguide and a second shared waveguide. As data is converted to an optical signal by the DFB laser, it traverses the first waveguide which ensures that the optical signal travels using a specific wavelength. Once the signal exits the first waveguide, it is transferred into the second waveguide by a lateral taper.

As the light travels through the shared waveguide, subsequent channels of data are combined with the existing light signal. Each individual channel exists as a separate wavelength of light and channels may be incorporated in a serial fashion as light traverses the shared waveguide. This configuration allows for the incorporation of multiple signals of data on a single optical fiber and eliminates the need for costly multiplexer structures for incorporation of multiple channels of data on a single optical fiber.

BRIEF DESCRIPTION OF THE DRAWINGS

To further clarify the above and other advantages and features of the present invention, a more particular description of the invention will be rendered by reference to example embodiments thereof which are illustrated in the appended drawings. These drawings depict only example embodiments of the invention and are not to be considered limiting in their scope. A brief description of each drawing is included below.

DETAILED DESCRIPTION OF THE INVENTION AND PREFERRED EMBODIMENTS

Detailed embodiments of the present invention are disclosed herein; however, as will be readily apparent to those skilled in the art, the present invention may be produced in other specific forms without departing from its spirit or essential characteristics. The present embodiments, are therefore, to be considered as illustrative and not restrictive, the scope of the invention being indicated by the claims rather than the following description, and all changes which come within the meaning and range of the equivalence of the claims are therefore intended to be embraced therein.

Figure 1:
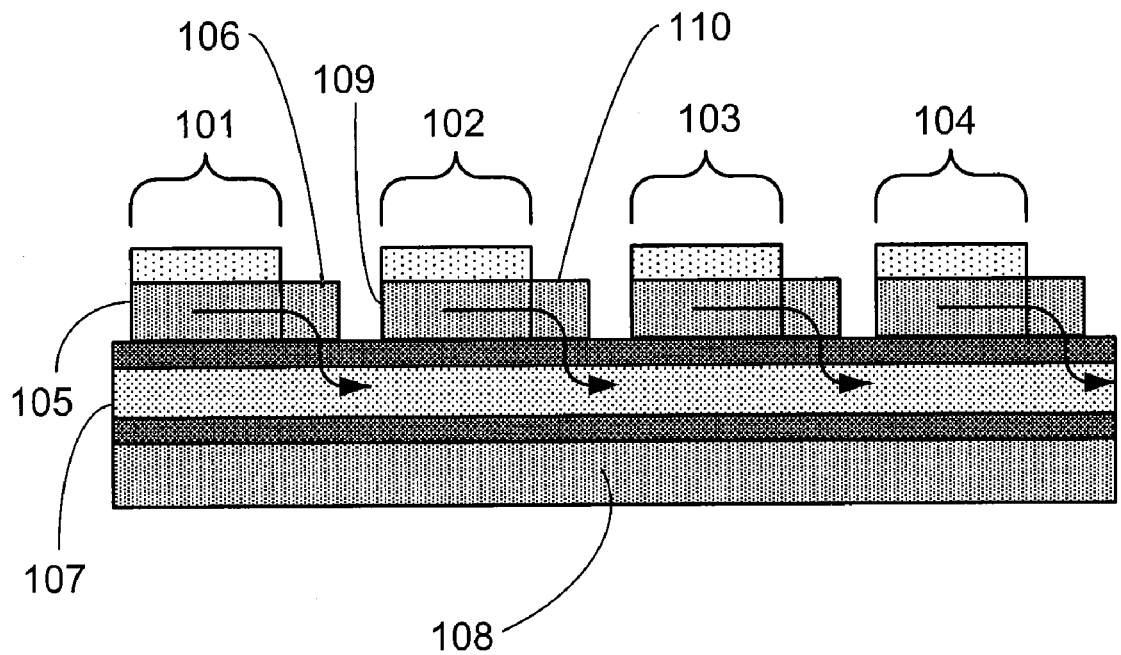
FIG. 1 is a cross sectional view of a serial array of DFB lasers in accordance with the present invention.
Figure 2:
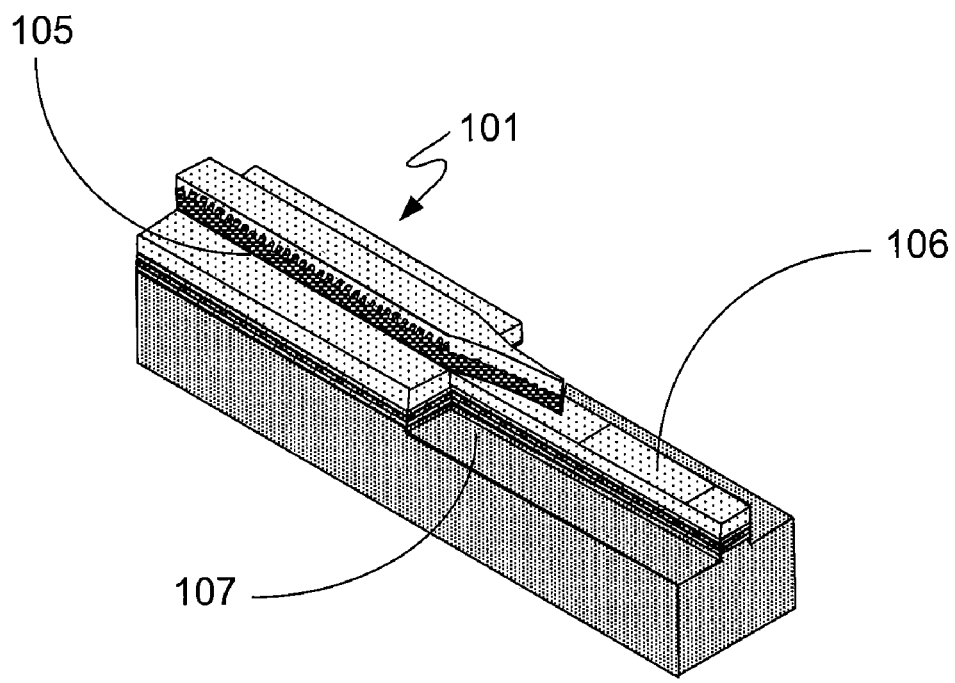
FIG. 2 is a perspective view of a DFB laser and twin waveguide coupling configuration.

Referring to FIGS. 1 and 2, the present invention is directed to a laser array structure used to provide a high bandwidth, low cost solution for the transmission of data without the need for use of a multiplexer to consolidate multiple optical signals. In one potential embodiment of the invention, the laser array is comprised of four individual channels, or streams, of data generated by four independent distributed feedback ("DFB") lasers. Each individual laser is coupled to a waveguide which modulates the optical signal to travel upon a specific wavelength, unique from the wavelength of any other data streams to be propagated down the shared waveguide. The first DFB laser 101 is mounted in conjunction with a first laser waveguide 105 unique to the first laser 101. Both the first DFB laser 101 and the first laser waveguide 105 are mounted above a shared waveguide 107 with the entire structure stacked vertically and further mounted vertical to a shared substrate 108. The coupling of the optical signal produced by the first laser 101 may be achieved by utilizing the twin-waveguide structure as disclosed in U.S. Pat. No. 6,483,863 B2, filed on Jun. 26, 2001, entitled "Asymmetric Waveguide Electroabsorption-Modulated Laser," the contents of which are hereby entirely incorporated by reference. The twin-waveguide structure is comprised of a twin-waveguide structure 106 unique to each individual optical DFB laser 101 which transfers the optical signal generated by the DFB laser 101 to a shared waveguide 107 vertically disposed below the individual laser waveguide 105.

Upon reaching the shared waveguide 107, the optical signal, which is propagated at a unique wavelength, is transmitted horizontally toward a second optical signal producing laser 102. Once again, a data signal is generated by the second DFB laser 102 on a specific wavelength and travels via the second laser waveguide structure 109. Upon exiting this second laser waveguide structure 109, the optical signal enters the second twin-waveguide 110 coupling apparatus and is transmitted vertically to the shared waveguide 107 structure. Upon entry to the shared waveguide 107 structure, the second optical signal transmitted on a wavelength to that of the first, and all other, optical signals is combined with the first optical signal. This configuration of individual waveguides 106, 109 (as examples) wherein each waveguide is located a different distance from the front (or end) portion of the shared waveguide 107 is defined as "serial" for purposes of this invention.

Subsequent repetition of these same steps is used to further combine individual data channels generated by third 103 and fourth 104 DFB lasers, with each optical signal generated on a unique wavelength. Upon the vertical transition of the individual optical signals to the shared waveguide 107 each is incorporated into the existing optical data stream although each travels independently and is segregated based on unique wavelengths.

What is claimed is:

1. A distributed feedback (DFB) laser array comprising a plurality of individual DFB lasers, the same number of individual waveguides, a shared waveguide having a front portion and an end portion, and, optionally, a substrate, wherein each individual DFB laser is coupled vertically to only one individual waveguide, and wherein each individual waveguide is in vertical contact with said shared waveguide in a serial configuration.

2. The DFB laser array of claim 1 wherein said shared waveguide is further in vertical contact with said substrate.

3. The DFB laser array of claim 2 wherein said substrate is an optical fiber.

* * * * *

UNITED STATES PATENT AND TRADEMARK OFFICE
CERTIFICATE OF CORRECTION

PATENT NO. : 7,653,271 B2  Page 1 of 1
APPLICATION NO. : 12/106784
DATED : January 26, 2010
INVENTOR(S) : Hongyu Deng It is certified that error appears in the above-identified patent and that said Letters Patent is hereby corrected as shown below:

On the title page

Item (73) should read, Assignee: Finisar Corporation

Item (74) should read, Attorney, Agent, or Firm — William S. Parks; Wyatt, Tarrant & Combs, LLP Signed and Sealed this Sixteenth Day of November, 2010

David J. Kappos
*Director of the United States Patent and Trademark Office*